United States Patent
Lee

(10) Patent No.: US 7,687,878 B2
(45) Date of Patent: Mar. 30, 2010

(54) MOSFET DEVICE HAVING SCREENING LAYERS FORMED BETWEEN MAIN GATE AND PASSING GATE AND METHOD FOR MANUFACTURING THE SAME

(75) Inventor: Eun Suk Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 121 days.

(21) Appl. No.: 11/938,873

(22) Filed: Nov. 13, 2007

(65) Prior Publication Data
US 2008/0224230 A1  Sep. 18, 2008

(30) Foreign Application Priority Data
Mar. 15, 2007  (KR) .................. 10-2007-0025763

(51) Int. Cl.
*H01L 29/78* (2006.01)
*H01L 21/76* (2006.01)
(52) U.S. Cl. .................. 257/510; 257/520; 257/374; 257/E29.021; 438/221; 438/430
(58) Field of Classification Search .................. 257/330, 257/374, 510, 520, E29.021; 438/221, 424, 438/430
See application file for complete search history.

(56) References Cited

U.S. PATENT DOCUMENTS

| 6,133,116 A | 10/2000 | Kim et al. | |
|---|---|---|---|
| 6,420,749 B1* | 7/2002 | Divakaruni et al. | 257/301 |
| 2006/0006410 A1* | 1/2006 | Lee et al. | 257/145 |

FOREIGN PATENT DOCUMENTS

| JP | 05-109886 | 4/1993 |
|---|---|---|
| KR | 1020030086355 | 11/2003 |

* cited by examiner

*Primary Examiner*—Minh-Loan T Tran
(74) *Attorney, Agent, or Firm*—Ladas & Parry LLP

(57) ABSTRACT

A MOSFET device includes a semiconductor substrate having an active region including storage node contact forming areas and a device isolation region and having a device isolation structure which is formed in the device isolation region to delimit the active region; screening layers formed in portions of the device isolation structure on both sides of the storage node contact forming areas of the active region; a gate line including a main gate which is located in the active region and a passing gate which is located on the device isolation structure; and junction areas formed in a surface of the active region on both sides of the main gate.

15 Claims, 5 Drawing Sheets

MOSFET DEVICE HAVING SCREENING LAYERS FORMED BETWEEN MAIN GATE AND PASSING GATE AND METHOD FOR MANUFACTURING THE SAME

CROSS-REFERENCE TO RELATED APPLICATIONS

The present application claims priority to Korean patent application number 10-2007-0025763 filed on Mar. 15, 2007, which is incorporated herein by reference in its entirety.

BACKGROUND OF THE INVENTION

The present invention relates to a MOSFET device and a method for manufacturing the same, and more particularly, to a MOSFET device which can suppress a passing gate effect and a method for manufacturing the same.

As the design rule for developing MOSFET (metal oxide semiconductor field effect transistor) devices have been decreasing, a channel length in the recently developed MOSFET devices have also decreased. According to this trend, not only the channel length of a cell transistor serving as a storage unit but also the channel length of the transistor of a peripheral circuit is decreased. Therefore, when attaining the target threshold voltage (Vt) of a MOSFET device required in a specific semiconductor device, limitations necessarily exist in using a conventional planar transistor structure.

In order to overcome this problem, researches have actively been made for a MOSFET device having a three-dimensional recess gate, which is formed in a manner such that grooves are defined by etching a semiconductor substrate and gates are formed in the grooves.

In the MOSFET device having this recess gate structure, since the etched portion of the semiconductor substrate is used as a channel, the channel length of the transistor can be secured, and an effective channel length can be increased.

However, in the MOSFET device having the recess gate, due to the structural characteristics of the recess gate, the electric fields of the adjoining recess gates interact upon each other since the adjoining gates are not electrically screened from each other. As a consequence, the threshold voltage (Vt) decreases by the voltages applied to the adjoining recess gates.

More specifically, a passing gate effect occurs in which a main gate formed in the groove is influenced depending upon the state of a passing gate. The passing gate effect causes the main gate to be influenced by the voltage of the passing gate, as the voltage of the passing gate increases and the potential of the main gate decreases. Consequently, as the influence from the field increases, the threshold voltage (Vt) of the main gate decreases. As a result, the passing gate effect decreases the threshold voltage of the main gate and increases the off-current of the MOSFET device.

SUMMARY OF THE INVENTION

Embodiments of the present invention are directed to a MOSFET device, which can suppress a passing gate effect and a method for manufacturing the same.

Also, embodiments of the present invention are directed to a MOSFET device which can suppress a passing gate effect and thereby prevent off-current from increasing and a method for manufacturing the same.

In one aspect, a MOSFET device comprises a semiconductor substrate having an active region (which includes storage node contact forming areas) and a device isolation region having a device isolation structure which is formed in the device isolation region to delimit the active region; screening layers formed in portions of the device isolation structure on both sides of each storage node contact forming area of the active region; a gate line including a main gate located in the active region and a passing gate located on the device isolation structure; and junction areas formed in the active region on both sides of the main gate.

The screening layers are made of a conductive layer.

The screening layers can be made of a polysilicon layer.

Each screening layer in the device isolation structure is formed to extend to a depth below the bottom of a junction area in the active region or to the bottom or substantially close to the bottom of the device isolation structure.

The gate line is formed in the shape of a recess.

In another aspect, a method for manufacturing a MOSFET device comprises the steps of forming a semiconductor substrate having an active region and a device isolation region having a device isolation structure formed in the device isolation region to delimit the active region, wherein the active region includes storage node contact forming areas; forming screening layers in portions of the device isolation structure on both sides of each storage node contact forming area of the active region; forming a gate line comprising a main gate located in the active region of the semiconductor substrate and a passing gate located on the device isolation structure of the semiconductor substrate; and forming junction areas in the active region on both sides of the main gate.

The step of forming the screening layers comprises the steps of defining holes in the portions of the device isolation structure on both sides of each storage node contact forming area of the active region; and filling a conductive layer in the holes.

The conductive layer comprises a polysilicon layer.

Each screening layer in the device isolation structure is formed to extend to a depth below the bottom of a nearby junction area in the active region or to the bottom or substantially close to the bottom of the device isolation structure.

After the step of forming the screening layers and before the step of forming the gate line, the method further comprises the step of recessing a portion of the semiconductor substrate where the gate line is to be formed.

DESCRIPTION OF SPECIFIC EMBODIMENTS

In the present invention, screening layers made of a conductive layer are formed in portions of a device isolation structure on both sides of the storage node contact forming areas of a semiconductor substrate. The screening layers serve to screen the passing gate effect. As a result, in the present invention, since it is possible to prevent the threshold voltage of a main gate from being decreased, the off-current characteristics of a transistor can be improved.

Hereafter, a MOSFET device and a method for manufacturing the same in accordance with specific embodiments of the present invention will be described with reference to the attached drawings.

Figure 1:
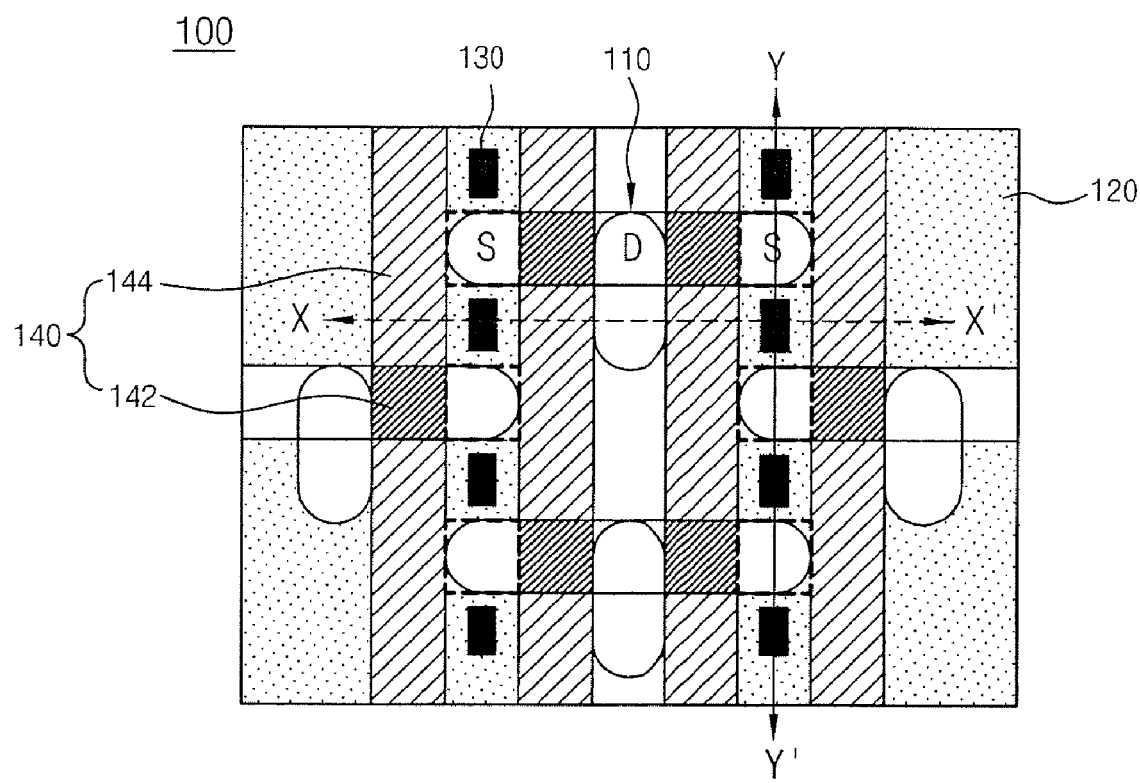
FIG. 1 is a plan view illustrating a MOSFET device in accordance with an embodiment of the present invention.
Figure 2:
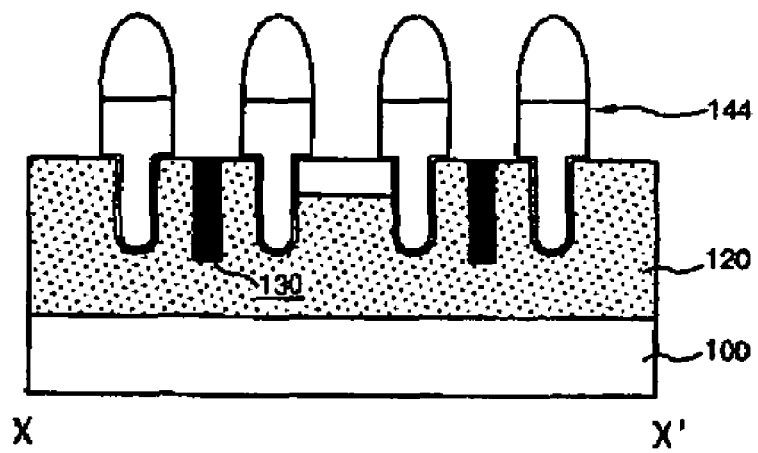
FIG. 2 is a cross-sectional view taken along the line X-X' of FIG. 1.

FIG. 1 is a plan view illustrating a MOSFET device in accordance with an embodiment of the present invention; FIG. 2 is a cross-sectional view taken along the line X-X' of FIG. 1; and FIG. 3 is a cross-sectional view taken along the line Y-Y' of FIG. 1.

Figure 3:
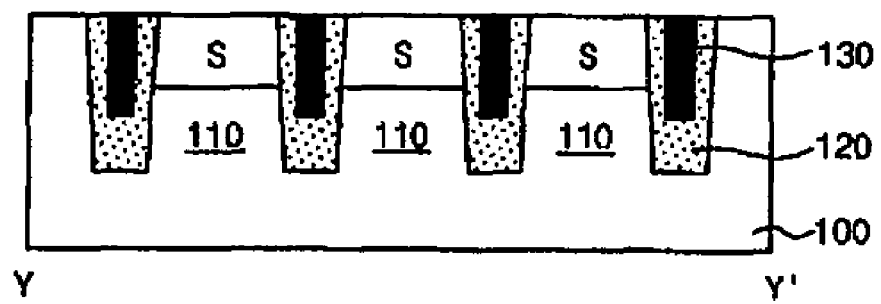
FIG. 3 is a cross-sectional view taken along the line Y-Y' of FIG. 1.

Referring to FIGS. 1 through 3, a MOSFET device includes: a semiconductor substrate 100 which has a device isolation structure 120 for delimiting a plurality of active regions 110, each active region having a plurality of storage node contact forming areas; screening layers 130 which are formed in portions of the device isolation structure 120 on both sides of the storage node contact forming areas of each active region 110; a gate line 140 which has a main gate 142 and a passing gate 144; and junction areas S and D which are formed in the surfaces of the active region 110 on both sides of the main gate 142.

The screening layers 130 are made of a conductive layer, for example, a polysilicon layer. The screening layers 130 are formed to extend from the surface of the semiconductor substrate 100 to the depth below the bottoms of the junction areas S and D or to the depth adjacent to the bottom of the device isolation structure 120. The main gate 142 is formed to be located in the active region 110, and the passing gate 144 is formed to be located on the device isolation structure 120.

In the MOSFET device according to an embodiment of the present invention, since the screening layers 130 made of a conductive layer are formed in the device isolation structure 120 on both sides of the storage node contact forming areas of the active region 110, the screening effect between adjoining gates can be improved due to the presence of the screening layers 130. Therefore, the undesired adverse influence of the passing gate 144 on the main gate 142, that is, the passing gate effect, can be suppressed.

Accordingly, in the present invention, since the passing gate effect can be suppressed, reduction in the threshold voltage of a cell can be minimized, and the off-current characteristics of the MOSFET device can be improved.

FIGS. 4A through 4F are plan views illustrating the processes of a method for manufacturing a MOSFET device in accordance with another embodiment of the present invention.

Figure 4A:
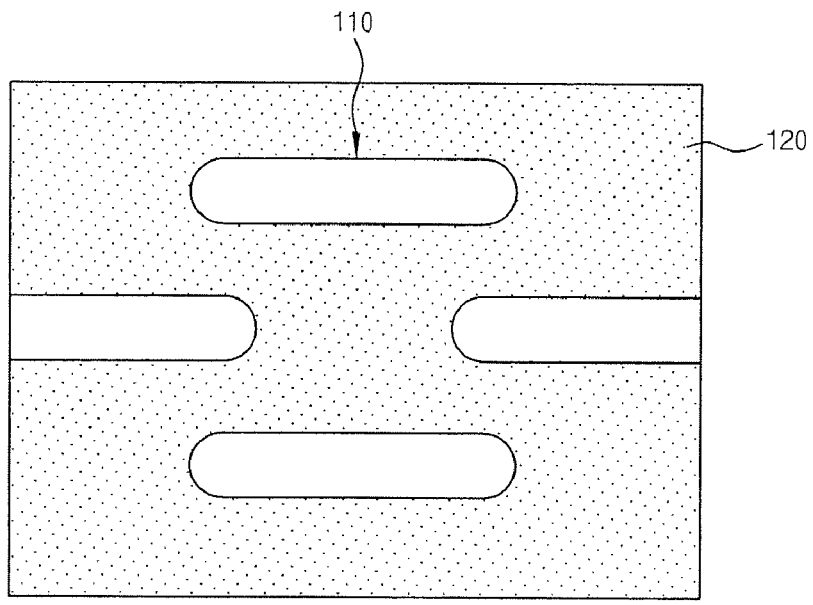
FIGS. 4A through 4F are plan views illustrating the processes of a method for manufacturing a MOSFET device in accordance with another embodiment of the present invention.

Referring to FIG. 4A, a semiconductor substrate 100 having active regions 110 each of which includes storage node contact forming areas and gate forming areas and a device isolation region is prepared. A device isolation structure 120 for delimiting the active regions 110 is formed in the device isolation region of the semiconductor substrate 100 by the STI (shallow trench isolation) process well known in the art.

Figure 4B:
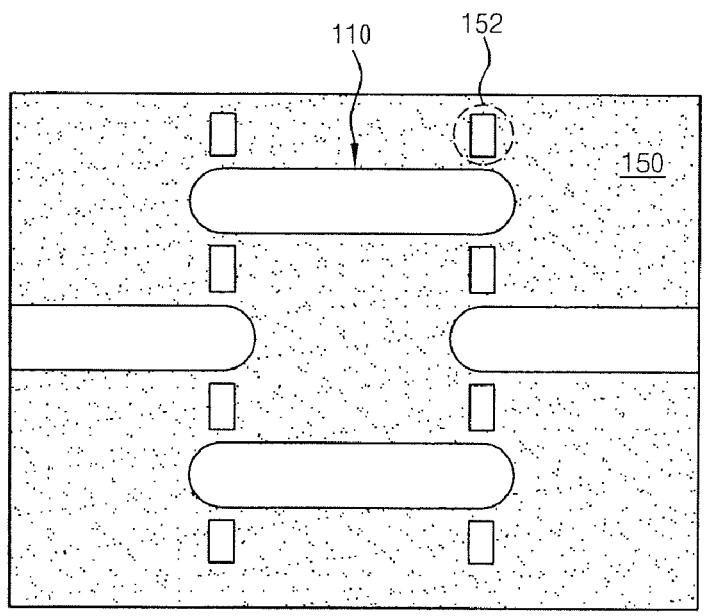

Referring to FIG. 4B, a mask pattern 150 is formed on the semiconductor substrate 100 including the device isolation structure 120 to have openings 152 which expose portions of the device isolation structure 120 on both sides of the storage node contact forming areas of the active region 110.

Figure 4C:
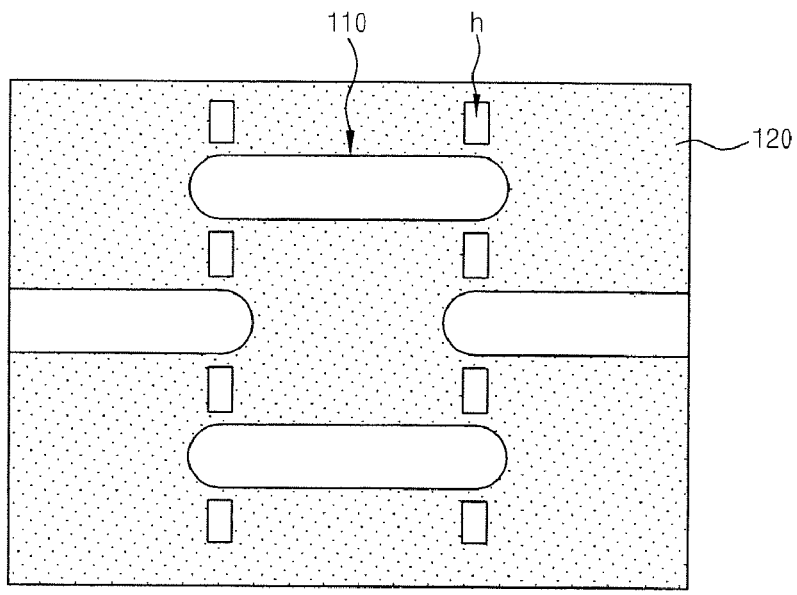

Referring to FIG. 4C, by etching the portions of the device isolation structure 120 which are exposed through the openings 152 of the mask pattern 150, holes 'h' are defined. The holes 'h' are defined to a depth, which reaches to the bottoms of the junction areas to be subsequently formed or adjacent to the bottom of the device isolation structure 120. Then, the mask pattern 150, which is used as an etch mask, is removed.

Figure 4D:
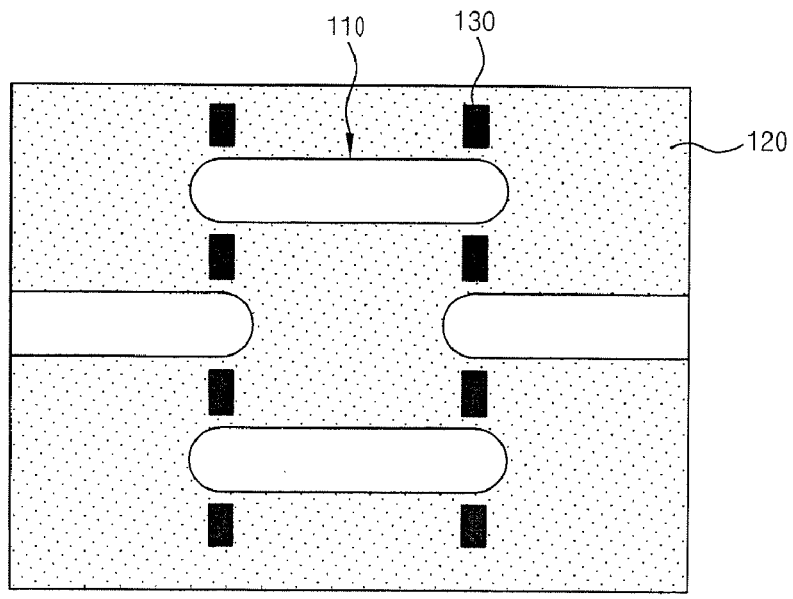

Referring to FIG. 4D, after depositing a conductive layer, preferably, a polysilicon layer on the overall surface of the semiconductor substrate 100 to fill the holes 'h', the polysilicon layer is chemically and mechanically polished ("CMPed") until the device isolation structure 120 is exposed, and through this, screening layers 130 made of the polysilicon layer are formed in the holes 'h'.

Figure 4E:
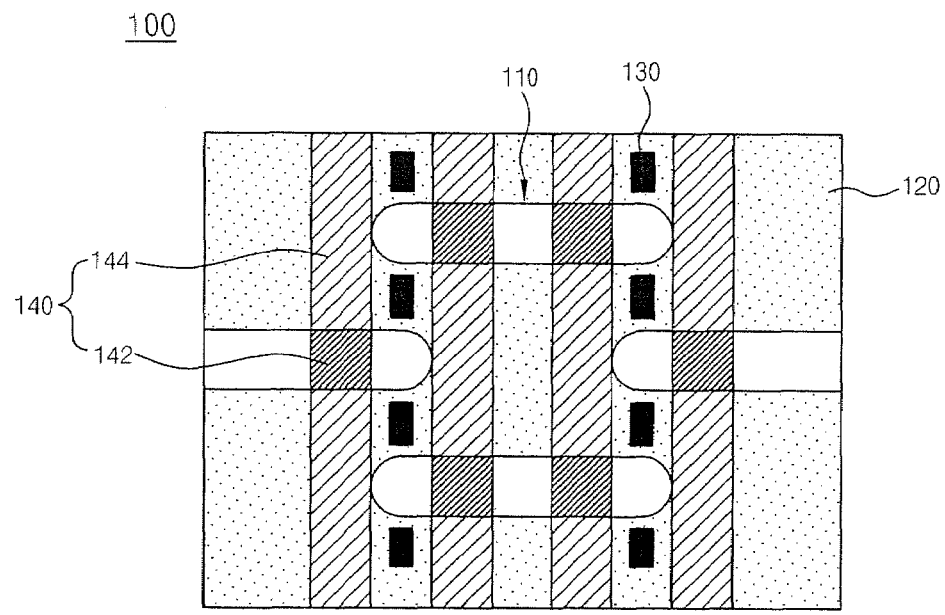

Referring to FIG. 4E, the gate forming areas of the semiconductor substrate 100, which is formed with the screening layers 130, are recessed. After forming an oxide-based gate insulation layer on the surface of the active region 110 of the recessed semiconductor substrate 100, a gate conductive layer made of a stack of a polysilicon layer and a metal-based layer and a nitride-based hard mask layer are sequentially formed to fill the grooves which are covered by the gate insulation layer.

By etching the hard mask layer, the gate conductive layer and the gate insulation layer, gate lines 140, each including a main gate 142 which is located in the active region 110 and a passing gate 144 which is located on the device isolation structure 120, are formed on the semiconductor substrate 100.

In the present invention, due to the fact that the screening layers 130 made of the polysilicon layer are formed in the portions of the device isolation structure 120 on both sides of the storage node contact forming areas, the screening quality between the main gate 142 and neighboring passing gates 144 can be improved. Due to this improvement of the screening quality, it is possible to prevent a field from being produced by the potential of the passing gate 144. Therefore, in the present invention, it is possible to prevent the threshold voltage (Vt) of a cell from being decreased, and the off-current characteristics of the MOSFET device can be improved.

Figure 4F:
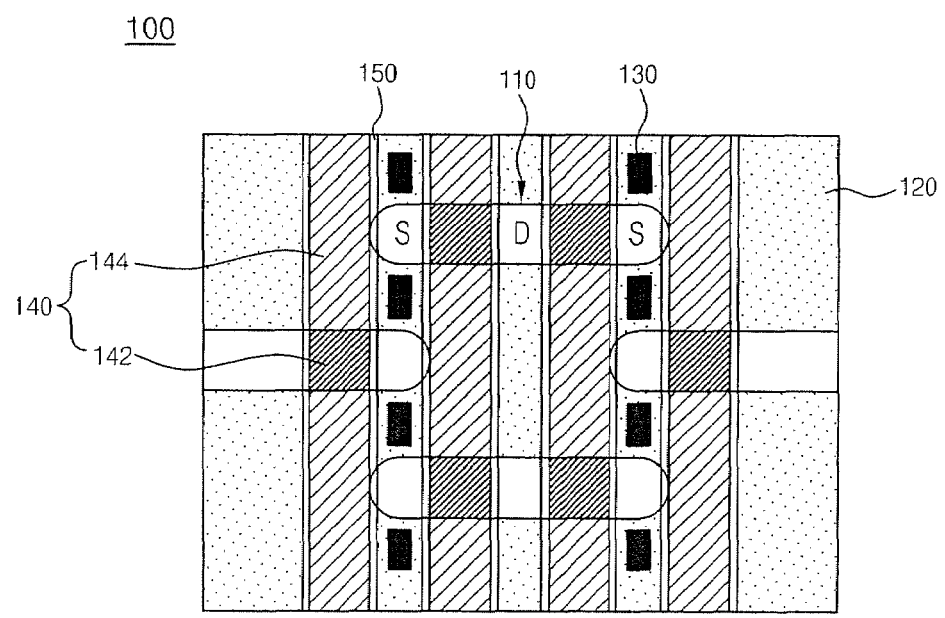

Referring to FIG. 4F, after depositing an insulation layer for spacers on the overall surface of the semiconductor substrate 100 including the gate lines 140, by etching the insulation layer, spacers 150 are formed on both sidewalls of each gate line 140. The spacers 150 can be formed of a single layer or multiple layers. By implementing high dosage ion implantation for the semiconductor substrate 100 formed with the spacers 150, junction areas S and D are formed in the surface of the active region 110 on both sides of the main gate 142 including the spacers 150.

Thereafter, although not shown in the drawings, by sequentially conducting a series of subsequent well-known processes, the manufacture of the MOSFET device according to the present invention is completed.

As is apparent from the above description, in the present invention, by forming screening layers in a device isolation structure on both sides of storage node contact forming areas, it is possible to suppress the passing gate effect. Accordingly, in the present invention, since it is possible to prevent a field from being produced by the potential of a passing gate, the threshold voltage of a cell is prevented from being decreased by the potential of the passing gate. As a consequence, the off-current characteristics of a MOSFET device can be improved, and further, the characteristics of a semiconductor device can be improved.

Although specific embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A MOSFET device comprising:
a semiconductor substrate having an active region and a device isolation region having a device isolation structure formed in the device isolation region to delimit the active region, wherein the active region includes storage node contact forming areas;

screening layers formed in portions of the device isolation structure on both sides of each storage node contact forming area of the active region, wherein the screening layers are each of an Island type and are formed so as to be not in contact with the storage node contact forming areas of the active region;

a gate line comprising a main gate located in the active region and a passing gate located on the device isolation structure; and junction areas formed in the active region on both sides of the main gate.

2. The MOSFET device according to claim 1, wherein the screening layers are made of a conductive layer.

3. The MOSFET device according to claim 2, wherein the screening layers are made of a polysilicon layer.

4. The MOSFET device according to claim 1, wherein each screening layer in the device isolation structure is formed to extend to a depth below the bottom of a nearby junction area in the active region or to the bottom or substantially close to the bottom of the device isolation structure.

5. The MOSFET device according to claim 1, wherein the gate line is formed in the shape of a recess.

6. A method for manufacturing a MOSFET device, comprising the steps of:

forming a semiconductor substrate having an active region and a device isolation region having a device isolation structure formed in the device isolation region to delimit the active region, wherein the active region includes storage node contact forming areas;

forming screening layers in portions of the device isolation structure on both sides of each storage node contact forming area of the active region, wherein the screening layers are each of an island type and are formed so as to be not in contact with the storage node contact forming areas of the active region;

forming a gate line comprising a main gate located in the active region of the semiconductor substrate and a passing gate located on the device isolation structure of the semiconductor substrate; and forming junction areas in the active region on both sides of the main gate.

7. The method according to claim 6, wherein the step of forming the screening layers comprises the steps of:

defining holes in the portions of the device isolation structure on both sides of each storage node contact forming area of the active region; and filling a conductive layer in the holes.

8. The method according to claim 7, wherein the conductive layer comprises a polysilicon layer.

9. The method according to claim 6, wherein each screening layer in the device Isolation structure is formed to extend to a depth below the bottom of a nearby junction area in the active region or to the bottom or substantially close to the bottom of the device isolation structure.

10. The method according to claim 6, wherein the method further comprises the step of:

recessing a portion of the semiconductor substrate where the gate line is to be formed, after performing the step of forming the screening layers but before performing the step of forming the gate line.

11. A MOSFET device comprising:

a semiconductor substrate having an active region and a device isolation region having a device isolation structure formed in the device isolation region to delimit the active region, wherein the active region Includes storage node contact forming areas;

island type screening layers each formed in a portion of the device isolation structure so as to be surrounded by the device isolation structure, the respective screening layers being formed on one of both opposing sides of each storage node contact forming area of the active region such that one of the screening layers is formed on each of the both opposing sides;

gate lines each comprising a main gate located in the active region and a passing gate located on the device isolation structure, wherein each of the screening layers is disposed vertically between two adjacent passing gates such that two adjacent passing gates are located at opposing sides of each of the screening layer; and junction areas formed In the active region on both sides of the main gate.

12. The MOSFET device according to claim 11, wherein the screening layers are made of a conductive layer.

13. The MOSFET device according to claim 12, wherein the screening layers are made of a polysilicon layer.

14. The MOSFET device according to claim 11, wherein each screening layer in the device isolation structure is formed to extend to a depth below the bottom of a nearby junction area in the active region or to the bottom or substantially close to the bottom of the device isolation structure.

15. The MOSFET device according to claim 11, wherein the gate line is formed in the shape of a recess.

* * * * *